US011522552B1

(12) United States Patent
Quilligan et al.

(10) Patent No.: US 11,522,552 B1
(45) Date of Patent: Dec. 6, 2022

(54) PIVOTING SUCCESSIVE APPROXIMATION REGISTER ADC FOR A RADIATION HARD AUTONOMOUS DIGITAL READOUT

(71) Applicant: United States of America as represented by the Administrator of NASA, Washington, DC (US)

(72) Inventors: Gerard T. Quilligan, Gulf Breeze, FL (US); Shahid Aslam, Washington, DC (US); Terry A. Hurford, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 17/373,989

(22) Filed: Jul. 13, 2021

(51) Int. Cl.
*H03M 1/06* (2006.01)

(52) U.S. Cl.
CPC ................................ *H03M 1/0617* (2013.01)

(58) Field of Classification Search
CPC ......... H03M 1/0617; H03M 1/10; H03M 1/38
USPC ........ 341/144, 155, 118, 120, 154, 159, 163
See application file for complete search history.

(56) References Cited

U.S. PATENT DOCUMENTS

| 9,887,703 B1* | 2/2018 | Zhang ................. H03M 1/1009 |
| 2011/0234433 A1* | 9/2011 | Aruga ..................... H03M 1/06 341/172 |

* cited by examiner

*Primary Examiner* — Peguy Jean Pierre
(74) *Attorney, Agent, or Firm* — Christopher O. Edwards; Bryan A. Geurts; Helen M. Galus (57) ABSTRACT

An analog digital converter that does not require a dedicated reference voltage, can digitize a rail-rail input signal and provide house-keeping functions to a ROIC or other IC. The RHADR system may operate without support from a main electronics board, which would only have to supply a power supply voltage to, and read the outputs from, the chip. This is achieved with (1) a Pivoting Successive Approximation Register ADC (PSAR ADC) and (2) radiation hard by design (RHBD) techniques.

20 Claims, 5 Drawing Sheets

PIVOTING SUCCESSIVE APPROXIMATION REGISTER ADC FOR A RADIATION HARD AUTONOMOUS DIGITAL READOUT

STATEMENT OF FEDERAL RIGHTS

The invention described herein was made by employees of the United States Government and may be manufactured and used by or for the Government for Government purposes without the payment of any royalties thereon or, therefore.

FIELD

The present invention relates to a Pivoting Successive Approximation Register (PSAR) analog-digital converter (ADC) used in a radiation hard autonomous digital readout (RHADR) system on a chip (SOC).

BACKGROUND

Readout integrated circuits (ROICs) must often rely on external support circuitry to provide critical housekeeping functions. Housekeeping functions include chip temperature, supply current and internal bias voltage measurements to ensure that the ROIC stays within thermal, current density and headroom limits. In addition, most ROICs are not radiation hard by design, and therefore must be spot shielded or placed in a metal vault to survive the harsh space radiation environments such as in the Jupiter orbital system (JOS).

The motivation behind the embodiments described herein was to provide a robust radiation hardened readout chip that functions remotely with just a single power supply voltage and a local clock source, all while broadcasting sensor and housekeeping data streams to a field programmable gate array (FPGA), micro-controller or other receiver system. A ROIC with a robust housekeeping digitizer function along with inherent radiation hardness provides a radiation hard autonomous readout system, abbreviated here as RHADR. By autonomous, we mean that the ROIC operates completely without clock, bias and control signals from the system that is receiving the data from the ROIC. The ROIC supplies its own clock and bias and broadcasts the sensor and housekeeping data in continuous multiple bit streams. The system receiving the data uses either clock recovery or the broadcast clock from the ROIC to decipher the housekeeping data words from the bit stream. The clock generation circuit is the subject of another patent disclosure. The RHADR has the additional advantage in that it may operate outside of a shielded radiation vault in close proximity to the sensors it is processing.

Key to this RHADR function is a robust, fast and accurate analog-digital converter for measurement of sensor and housekeeping parameters, such as supply current, temperature, supply voltage and the values of various bias settings. The need for fast measurements stems from the fact that a single digitizer must often work with many housekeeping signals through an analog multiplexer. In addition, the speed requirement is dictated by the need to act fast to mitigate potentially destructive conditions such as latch-up. Unusual fluctuations in temperature, supply or bias voltages can indicate an impending or active anomalous condition caused by heavy ion or other particle hits which the system can mitigate with enough warning. In addition, there is a need for the ADC to have minimal reliance on internal or external support circuitry, such as a voltage reference. A robust ADC would not need a separate reference voltage and would simply use the power supply voltage directly. In addition, reliability is enhanced if there are no specialized internal components such as boosted or bootstrapped switches which can create voltages which exceed the power supply voltage as with some prior art designs.

A further improvement is if the ADC can accommodate rail-to-rail input signals thus obviating the need for power hungry voltage buffers and level shifters.

A robust low complexity ADC architecture is described in the following disclosure.

SUMMARY

Certain embodiments of the present invention may provide solutions to the problems and needs in the art that have not yet been fully identified, appreciated, or solved by current ROICs. For example, some embodiments of the present invention pertain to an analog digital converter that does not require a dedicated reference voltage, can digitize a rail-rail input signal and provide house-keeping functions to a ROIC or other IC. The RHADR system may operate without support from a main electronics board, which would only have to supply a power supply voltage to, and read the outputs from, the chip. This is achieved with (1) a Pivoting Successive Approximation Register ADC (PSAR ADC) and (2) radiation hard by design (RHBD) techniques.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to a RHADR function. The RHADR integrated circuit (IC) may operate without support from a main electronics board (MEB), which only has to read the outputs sent from the chip. The RHADR IC may utilize a single voltage power supply (e.g. 1.8 or 3.3 V), an on-board clock source, and one or more passive components, such as resistors and capacitors, to help set the oscillation frequency for the chip clock generator. The RHADR IC in some embodiments broadcasts digitized data on multiple outputs to an FPGA, a micro-controller or a MEB. The RHADR IC may digitize both voltages and currents at the microvolt and nano-amp level with optional user selected gains. The RHADR IC is also radiation hardened by design to be immune to high levels of total ionizing dose (TID), heavy ions and has inherent protection against single event upsets (SEUs).

The RHADR IC, in some embodiments, is used for remote telemetry such as temperature sensors, seismometers, gas monitoring, salinity monitoring, and radiation dose monitoring, to name a few. The RHADR IC may also be powered from one or two (in series) 1.5V battery cells.

We will now describe the working principle of the PSAR ADC, followed by an exemplary description of the operation. Referring to FIGS. 1 to 5, the housekeeping ADC architecture uses a modified successive approximation sequence which relies on a single sampling capacitor with sample and hold switches, a segmented resistor DAC partitioned into a coarse output DAC (CDAC) and a fine output DAC (FDAC), a latched comparator and a Pivoting algorithm directed by coarse and fine SARs. By "Pivoting", we mean that the normal convergence sequence for a classic SAR is modified such that it is bifurcated into coarse and fine convergence intervals utilizing both inputs of a latched comparator. The successive approximation interval is thus comprised of two phases: a rising slope "coarse" phase and a "fine" phase correction slope dependent on the residue sign at the end of the coarse phase. The pivot direction is dependent on the sign of the residue at the end of the coarse phase.

Both the CDAC and FDAC inputs are binary format but each binary code is decoded into a corresponding thermometer code when selecting the switches tapping off of the reference resistor.

In the coarse phase, a segmented resistor DAC with tap selection switches is used to generate an approximation of the input signal ($V_{IN}$) present across a sampling capacitor $C_1$ at sampling instant $t_0$. The signal sampled onto the sampling capacitor $C_1$ ($V_{HOLD}$) is equal to: $V_{HOLD}=V_{IN}-V_{CM}$ where $V_{CM}$ is the common-mode reference voltage. The value of $V_{CM}$ is set to maximize the gain-bandwidth product of the comparator input stage and is generally equal to half of the power supply range (e.g. 1.65V if $V_{DD}$=3.3V and $V_{SS}$=0V).

The coarse phase runs for an integer number of clock cycles equal to 'C' resulting in a coarse approximation word equal to '$C_{WORD}$'. In the fine phase, switched taps off of the mid-section of the same fully segmented resistor DAC are selected by the SAR algorithm to help generate a more accurate approximation of the input signal but with a slope dependent on the sign of the residue at the end of the coarse phase. The FDAC is essentially two subranges (positive and negative) of the segmented DAC used for the CDAC. Which subrange the FDAC output is in depends on the sign of the residue at the end of the coarse phase. The fine phase takes an integer number of clock cycles equal to 'F' resulting in a fine approximation word equal to '$F_{WORD}$'. The final output value is computed by the following equation:

$$O_{WORD}=C_{WORD} \times 2^{N-C} \pm F_{WORD} \quad\quad \text{Equation (1)}$$

In Equation (1), N represents the resolution of the complete PSAR ADC. Thus, the output word is the sum of the coarse word multiplied by 2 raised to the power of the difference between N and C plus (or minus) the fine word. The value of F must be at least equal to N-C but preferably higher to enable error correction of the $C_{WORD}$ which may incur settling time errors.

The PSAR requires that both inputs of the latched comparator are driven in each phase in such a way as to minimize the residue defined as $V_P-V_N$ where $V_P$ is the comparator positive input voltage and $V_N$ is the comparator negative input voltage. During the conversion cycle, the $V_N$ voltage equals:

$$V_N=V_{CDAC}-(V_{IN}-V_{CM}) \quad\quad \text{Equation (2)}$$

where $V_{CDAC}$ is the coarse output voltage from the DAC.

The residue seen at the inputs of the comparator is given as:

$$V_\in=V_P-V_N=V_{FDAC}+V_{IN}-V_{CDAC}-V_{CM} \quad\quad \text{Equation (3)}$$

It can be seen from Equation (3) that $V_{CDAC}$ should be increased in the coarse phase and $V_{FDAC}$ should be decreased in the fine phase if the sign of the residue at the end of the coarse phase is positive or increased if the sign of the residue at the end of the coarse phase is positive to reduce the residue voltage to zero.

For the coarse phase, $V_P=V_{CMX}$ where $V_{CMX}$ is the voltage of the mid-point of the segmented DAC (e.g. 1.65V using $V_{RT}$=3.3V and $V_{RB}$=0V). This corresponds to a fine code of all zeros (F=0 . . . 0) and may differ from the $V_{CM}$ voltage in that the latter is provided through a low output impedance buffer which may have non-zero offset voltage.

For the fine phase, $V_P=V_{FDAC}$ with $V_N$ held constant at the final value from the coarse phase. If the residue in the last clock cycle of the coarse phase was positive, then the value of $V_{FDAC}$ should be falling and vice versa. The overall action of the two phases is to drive the residue towards zero volts.

The PSAR approach results in a simpler segmented DAC needing only $2^C$ plus $2^F$ taps instead of $2^N$ taps with the added advantage of fast settling times. This is because the fine taps are taken near the mid-section of the segmented DAC resulting in fewer transmission gates and a smaller parasitic capacitance. In addition, the fine convergence phase varies the value of $V_{FDAC}$ with respect to the comparator common mode (CM) input reference voltage, allowing optimal response from the comparator. The fine DAC output can settle faster because it drives less parasitic capacitance (i.e., no switches or bottom plate capacitance) than the coarse output. Hence there is the opportunity to throttle the conversion clock speed depending on the conversion phase.

Having a fine resolution greater than (N–C) bits allows the fine phase to correct for any settling errors that may have accrued during the coarse phase. For each extra bit, the error correction range is doubled at the expense of one clock cycle per bit.

Figure 1:
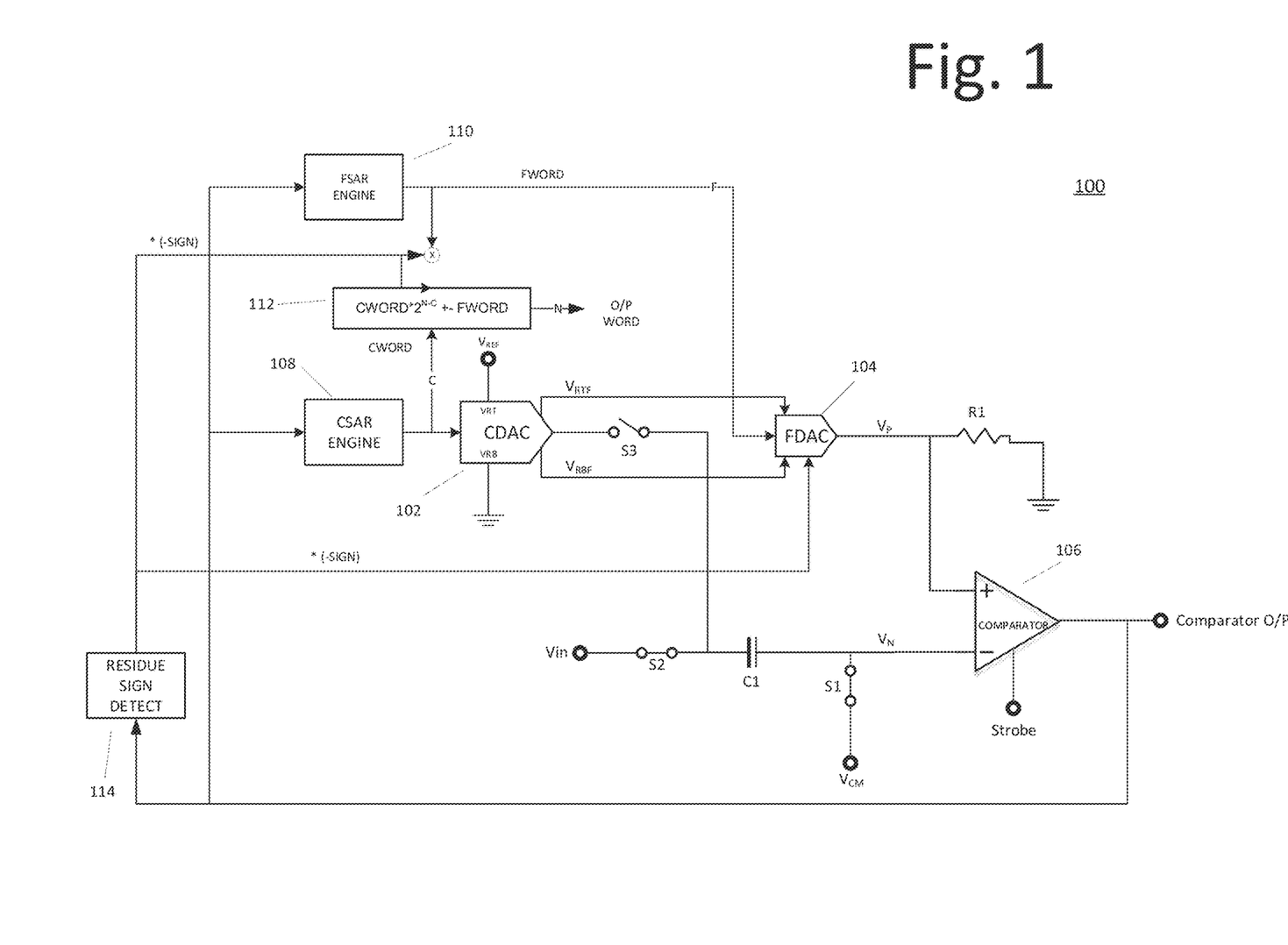
FIG. 1 is a diagram illustrating a PSAR ADC, according to an embodiment of the present invention.

We will now describe the operation of the PSAR ADC in terms of an example where N=12, C=8 and F=5. FIG. 1 is a diagram illustrating a PSAR ADC 100, according to an embodiment of the present invention. PSAR ADC 100 may use binary scaled DAC outputs to successively arrive at the approximation of the input signal. Components of PSAR ADC 100 include a coarse DAC (CDAC) 102, a fine DAC (FDAC) 104, a latched comparator 106, a coarse successive approximation register (CSAR) engine 108, a sign detection block 114, a fine successive approximation register (FSAR) engine 110, an error correction block 112, and a $V_{CM}$ voltage buffer and switches S1-S3.

In one embodiment, a single SAR sequencer provides the test bits for (C+F) bits. In other embodiments, a CSAR engine 108 and FSAR engine 110 are individual blocks responsible for exercising or testing certain bit sequences. For example, a CSAR engine 108 may start at the code 1000 0000, with the length of the code being 8 bits long. The FSAR code may be set to all 0s while CDAC 102 is exercising its bit sequence.

During the beginning of the quantization (i.e., converting the analog signal to its digital approximation) phase, an analog signal arrives through $V_{IN}$ with switches S1 and S2 being closed and switch S3 being open. This charges capacitor C1 up to the difference between $V_{IN}$ and $V_{CM}$. This difference may then be stored across capacitor C1.

Inherent to this architecture is a sample-hold that is built into the system and is comprised of switches S1 and S2 and capacitor C1. When sampling the signal, switches S1 and S2 are closed and switch S3 is open. When the input signal is to be held on the capacitor C1 (in HOLD mode), switch S1 is opened first, followed by opening switch S2 and then closing of switch S3, all of which happens in succession albeit delayed slightly by non-overlapping intervals. As soon as switch S1 is opened, the input signal arriving at $V_{IN}$ is stored across capacitor C1 and the value of the voltage on capacitor C1 is $V_{IN}$ minus $V_{CM}$. That voltage is substantially present for the entire duration of the conversion.

Note, there are two intervals associated with the operation of the ADC—a sample interval and a conversion interval. There are also two phases associated with the conversion interval: coarse and fine. For the actual conversion sequence to proceed, switch S3 is closed. In this embodiment, CSAR engine 108 and FSAR 110 control the exercising of the bits to CDAC 102 and FDAC 104. It should be noted that some conventional ADCs use a single DAC to compare its output voltage with the input signal held on the capacitor. In some embodiments of the subject invention, however, CDAC 102 has a resolution of C bits and FDAC 104 has an effective resolution of at least F=N−C bits where N is the overall resolution of the PSAR ADC.

During the coarse phase, the CSAR 108 engine drives CDAC 102 with binary weighted test bits starting with the MSB (most significant bit) being set to a logic one while FDAC 104 output is set to approximately mid-scale ($\sim V_{CM}$) due to the FSAR output being set to all zeros. For example, the first CSAR test word would be 1000 0000 for an 8-bit coarse phase. When the first test word is applied to CDAC 102, the CDAC 102 output voltage slews and settles to one-half of the Vref voltage which subtracts from the value stored at capacitor C1 as seen at the negative input of comparator 106. So, in the coarse phase, CDAC 102 is exercised where the coarse voltage is subtracted from the voltage on capacitor C1, and at comparator 106 inputs, comparator 106 compares the subtracted result with the output value from FDAC 104. If the output of comparator 106 is a 1, the exercised test bit is retained, i.e., the value of MSB bit=1 is retained.

Next, the subsequent coarse bit is tested. For example, the second MSB of the CSAR word is set to a 1, so that if the MSB bit remained at a 1, the code applied to the CDAC would be 1100 0000 which would slew the CDAC output to ¾ of full scale. Alternatively, if the MSB had been reset to 0 because the comparator had output a 0 in the previous test, the code applied to the CDAC would be 0100 0000 which would slew the CDAC output to ¼ of full scale. Regardless of whether it is ¾ or ¼ of full scale, the new CDAC output voltage is again subtracted from the voltage on capacitor C1. The subtracted value is again compared at comparator 106 with the output value at FDAC 104. If the compared value is 1, the bit is retained; otherwise, the bit is discarded. This comparison continues all the way down to the least significant bit (LSB) of CDAC 102.

Once all bits of CDAC 102 have been compared, the final coarse word is held and FDAC 104 is now varied in a binary fashion during the fine phase. FSAR engine 110 will begin by setting its MSB set to a 1 and its LSBs set to 0s and proceed down through the bits of the word of the FSAR. In this embodiment, instead of varying the voltage across capacitor C1 to finality, the positive input of comparator 106 is also varied to complete the conversion.

Conventional SAR DACs converge in a single direction, e.g., the DAC starts off with 0 volts and works up to a final voltage (i.e., an approximation of the input signal). In some embodiments, however, the coarse phase may operate similarly, but with the fine phase, the output voltage of FDAC 104 may rise or fall because it is connected to the opposite sign input of the comparator. In other words, some embodiments have a bi-directional DAC output characteristic rather than a unidirectional characteristic.

What this does is that it allows the system to generate two words—a coarse word and a fine word. The coarse word is C bits long and the fine word is F bits long for an N bit ADC. Minimally, F=N−C which may be adequate if there are no DAC settling errors or a very low probability of a comparator misfire. However, such a scenario is unlikely. In general, F should be >N−C, for example N−C+1 bits. For example, for N=12, C=8 and F=5. Since 8+5 is 13, a redundancy of one bit is realized. This way, in the fine word, the extra bit (i.e., bit 4) is used to correct any errors that may have occurred in the coarse phase. For example, the incomplete settling of a DAC signal and thus the residue at the comparator inputs may cause an error in the coarse phase which could persist through the end of conversion. With the extra fine bit, a settling error of up to 1 coarse LSB can be rectified. The value of N is thus determined by adding C and F if the sign detection output is a −1 and subtracting F from C if the sign detection output is a 1. Because some conventional systems only use a single conversion phase, the bit sequence result is irrevocable, and the error cannot be rectified as shown and discussed herein. Specifically, some SARs cannot correct an error that previously occurred in the bit test sequence however some prior art solutions include using redundant test bits whereby some of the bit tests are repeated. Retesting some bits incurs a time penalty because extra clock cycles must be included in the conversion interval resulting in a slower conversion rate. In contrast, with the two phase embodiments described herein, an error that previously occurred in the coarse phase may be corrected by using the extra bit(s) from the fine phase. Similar to prior art solutions this incurs a time penalty of a clock cycle per bit however the invention may mitigate this by throttling the conversion clock to run faster in the fine phase where settling times are much shorter than in the coarse phase.

All ADCs require a specialized stable reference voltage to which the conversion refers to. However, some embodiments do not require a specialized reference. Instead, using a $V_{SUPPLY}$, which is the ADC power supply voltage spanning, for example 0-3.3V, CDAC 102 full-scale may be set to $V_{SUPPLY}$ and this would allow the ADC to digitize input voltages spanning the full power supply range. This scheme though simplistic may allow for the ADC word to be reasonably accurate within the limits of the stability of $V_{SUPPLY}$ although this source may be set by a dedicated Vref output which is very stable. Simply put, a Vref equal to the power supply $V_{SUPPLY}$ may be used as a reference voltage eliminating the need for a dedicated reference voltage if the $V_{SUPPLY}$ is stable enough for the application's accuracy requirements.

The $V_{SUPPLY}$ value being used as a DAC reference voltage allows the sampling of the input signal directly onto capacitor C1, eliminating the need for any intervening buffers, amplifiers, or level shifters. That means an input voltage swing equal to the full range of the ADC power supply can be realized.

Another advantage over conventional systems is that switch S2 need not be a specialized switch, given that switch S2 undergoes non-linear changes in its on-resistance versus the input signal. This eliminates the need for a boosted or bootstrap switch which is used in some prior art SAR ADCs. For example, an input signal from $V_{IN}$ may arrive at switch S2 and may be stored with non-linearity from S2 at capacitor C1. When the system is moved into the conversion phase, capacitor C1 may then be driven from CDAC. Further, with switches S2 and S3 being the same, the coarse phase linearity errors of the switches may approximately cancel, obviating the need for a boosted or a bootstrap switch.

Regarding DACs, conventional systems may use a sub-ranging DAC with at least two sub-DACs, where the output of the FDAC depends on the final output of the CDAC. The FDAC may then generate its LSBs based on the final output of the CDAC. In some embodiments similar to the subject invention, however, top and bottom reference taps (i.e., $V_{RTF}$ and $V_{RBF}$) of FDAC 104 are not varied on the taps of CDAC 102. In other words, in some embodiments FDAC 104 top and bottom reference voltages are permanent and are not switched and are not dependent on the output of CDAC 102. This may reduce the additional settling time that is otherwise needed for compensating switches in series with the FDAC taps. This benefit is realized because the positive input of comparator 106 is driven directly from the output of FDAC 104 which sees a relatively small capacitive load. This is beneficial to the performance of comparator 106, because the positive input of comparator 106 does not vary more than plus or minus $2^{F+C-N}$ coarse LSBs away from its optimum common-mode voltage. In this embodiment example, the gain of comparator 106 remains roughly constant if the positive input remains within $2^{F+C-N}$ coarse LSBs of the common-mode voltage because the voltage on the negative input will have converged within $2^{F+C-N}$ coarse LSBS of the common-mode voltage.

Also, the settling times of FDAC 104 output are significantly less than the settling times of CDAC 102 output because CDAC 102 must drive parasitic capacitances associated with the interconnect, the switches S1, S2, and S3 and capacitor C1. In other words, CDAC 102 settling response is slower than the settling response of FDAC 104, because FDAC 104 only has to drive the positive input of comparator 106 and its associated gate and interconnect capacitance.

Because CDAC 102 has a slower response than FDAC 104 with respect to settling, throttling of the conversion clock cycle may be implemented depending on which phase is operational. For example, in the coarse phase, the clock period for each bit may be longer than the clock period for each bit in the fine phase. With this example, the coarse phase would run slower in term of the length of the clock cycles than the fine phase. To get a faster ADC, the clock may be sped up after transitioning to the fine phase. If the clock is run too fast in the coarse phase, there may be settling time errors, causing comparator 106 to produce an incorrect sign (residue) output. However, with the redundancy as discussed above, the error may be partially or completely corrected.

DAC embodiments described herein use a resistor ladder, which is robust in the sense that the resistors may be arranged as a fully segmented architecture which ensures monotonicity. Full segmentation means there is one resistor for every coarse LSB. The main accuracy issue with the subject invention is associated with fitting the FDAC 104 transfer function to an integral number of CLSBs. In the above example where N=12 with C=8, 256 individual resistors may comprise CDAC 102, all of which are arranged in a resistor divider with 255 individual taps. Progressing from bottom to top of the resistor divider, the voltage taps have an inherent monotonically increasing output however integral non-linearity (INL) may still be non-zero due to accumulated segment errors.

The ADC system can only be as good as the DAC it is built with. FDAC 104 in itself is a segmented DAC which is an integral part of another segmented DAC (i.e., CDAC 102). This arrangement fulfils one condition for no missing or false codes: the voltage difference across the top and bottom reference inputs of FDAC 104 is equal to an integral multiple of coarse LSBs.

Another condition for no missing or false codes in this arrangement relates to the integral linearity signature of the entire reference resistor. The INL at the mid-point of the CDAC and FDAC strings must be less than one half of an N bit LSB compared to the INL at any point in the transfer function because the system always switches to the mid-section of the transfer function in the fine phase. This transition is the most vulnerable point for a DNL error. The way to minimize this error is to ensure that the segment mismatches are randomized or at the very least prevent errors accumulating over any set of segments longer than $2^{C-N}/m$ where m is the mismatch. Thus the resistor segments could be grouped in sets of 16 segments for a 12-bit ADC with an 8-bit CDAC with orientation changed at the group boundaries.

Yet another condition for no missing or false codes in this arrangement relates to the parasitic capacitance at the negative input of the comparator. This capacitance is the sum of the parasitic capacitances of the switch S1, of the gate of the comparator negative input terminal, of the top plate of C1 and of the interconnect between C1 top plate and the negative input terminal of the comparator. It's presence acts to attenuate the CDAC generated differences at the negative input terminal of the comparator which can cause missing or false codes at the coarse and fine SAR boundaries. This attenuation if not applied to the positive input of the comparator will cause the FDAC range to be a non-integral value of the CDAC LSB size. Thus resistor R1 is present in FIG. 1 which must be sized to replicate the attenuation effect of the parasitic capacitance effect on the negative input of the comparator. This resistor should be constructed from the same material (e.g. polysilicon) as that used in the CDAC/FDAC segments.

In some embodiments, the DAC is partitioned into two distinct sections—CDAC 102 and FDAC 104. In this exemplary embodiment, the DAC is a single resistor tree, i.e., a $2^C$ element resistor. $2^C-1$ of the taps are at the coarse LSB level and 2 of the mid-section taps drive a $2^F$ tap resistor sub-network embedded within the resistor tree. These $2^F$ sub-taps reflect the fine (N-bit) LSB differences. The overall system may be monotonic so long as the coarse segmented resistor has a baseline of C-bit matching between the segments and the segment mismatches are random. For example, in a 12-bit system with an 8-bit FDAC the contiguous resistor segments may have to match within 0.1 percent of each other.

Figure 2:
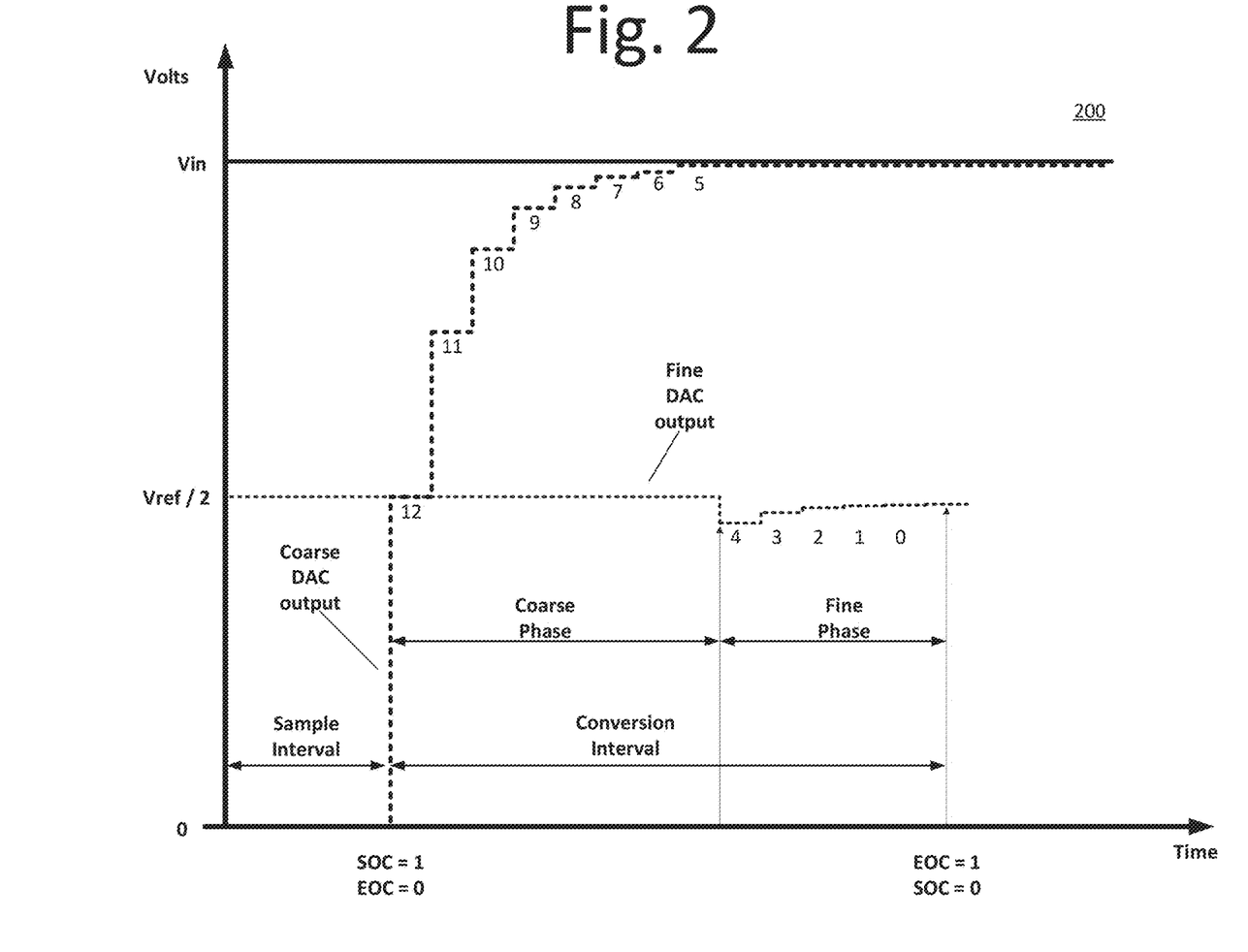
FIG. 2 is a graph illustrating an example of the coarse and fine SAR sequences, according to an embodiment of the present invention.

FIG. 2 is graph 200 illustrating an example of the coarse and fine SAR sequences, according to an embodiment of the present invention. In this example, the FSAR engine has selected a falling slope convergence algorithm for the FDAC to reduce the residue to zero. Thus, the C and F words are added in the following way to generate the output word N:

$$C = 1111\ 1111\ 0000$$

$$F = \phantom{1111\ 1111\ }0\ 1111$$

$$N = 1111\ 1111\ 1111$$

Note that the MSB of the fine word is zero indicating no error correction was applied.

Figure 3:
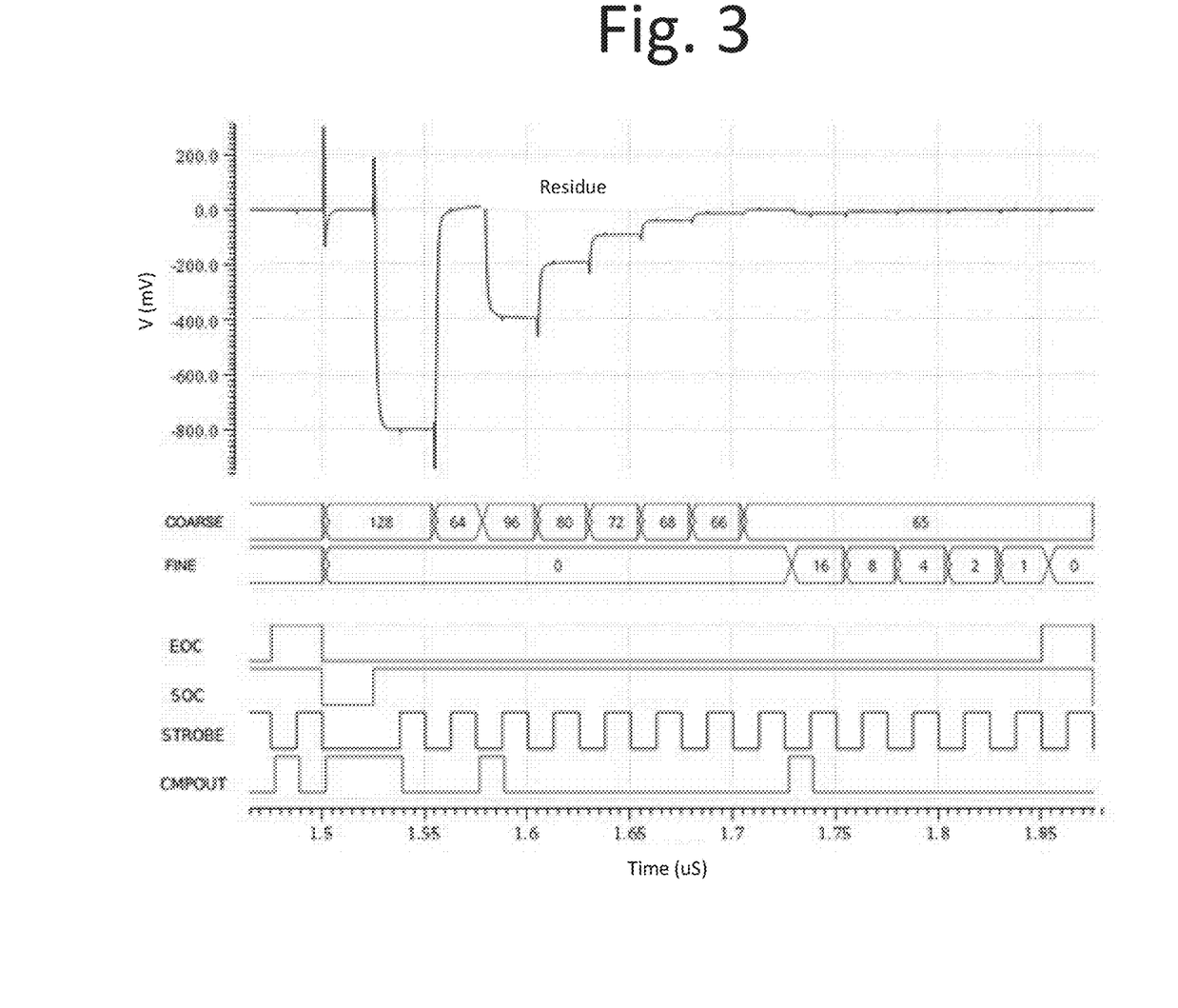
FIG. 3 is a graph illustrating an example of the residue versus time along with timing signals, according to an embodiment of the present invention.

FIG. 3 is a graph 300 illustrating an example of the residue versus time along with timing signals, according to an embodiment of the present invention. In FIG. 3, the conversion is initiated by asserting the SOC (start of convert) signal to a 1 from a 0. Slightly after SOC changes to a 1, the S1 switch is opened. Then S2 is opened followed by S3 closing. The first 8 bit trials are in the coarse phase with the balance in the fine phase. Shown in the top panel is the convergence of the residue to near zero volts. An end of convert (EOC) signal transitioning to a logic 1 from 0 may indicate the completion of the conversion.

Figure 4:
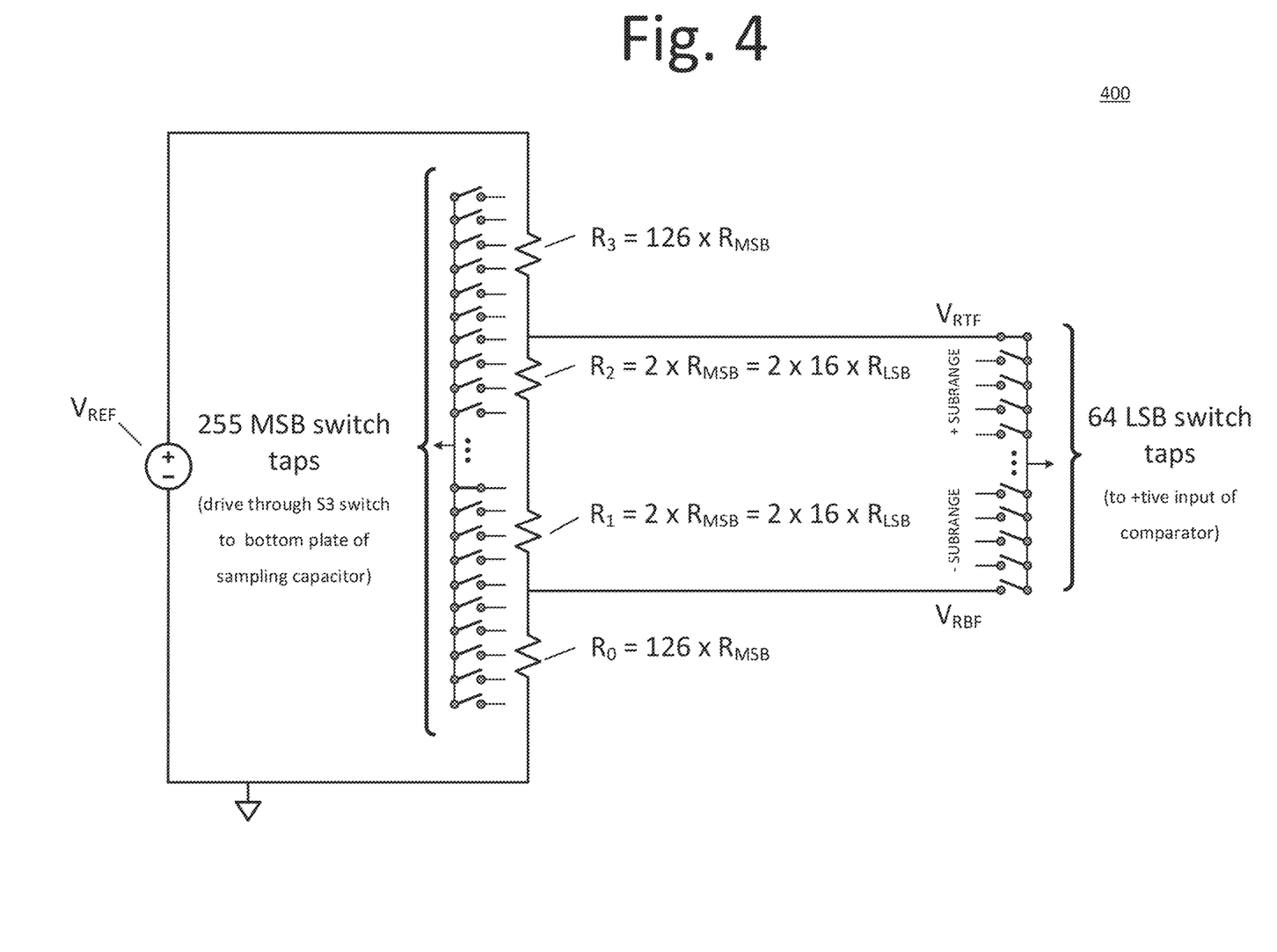
FIG. 4 is a diagram illustrating a 12-bit segmented DAC used in the PSAR, according to an embodiment of the present invention.

FIG. 4 is a diagram illustrating an exemplary 12-bit segmented DAC 400 used in the PSAR, according to an embodiment of the present invention. In FIG. 4, segmented DAC 400 is comprised of 256 equal valued 'coarse' segments with 255 'coarse' LSB taps. Four of the mid-section segments each have 16 'fine' LSB taps. There are a total of 64 'fine' LSB taps. Only half of these fine taps are utilized during any conversion cycle due to the sign bit selecting either the upper or lower 32 LSB taps depending on the residue sign resulting from the last test bit of the coarse phase.

Figure 5:
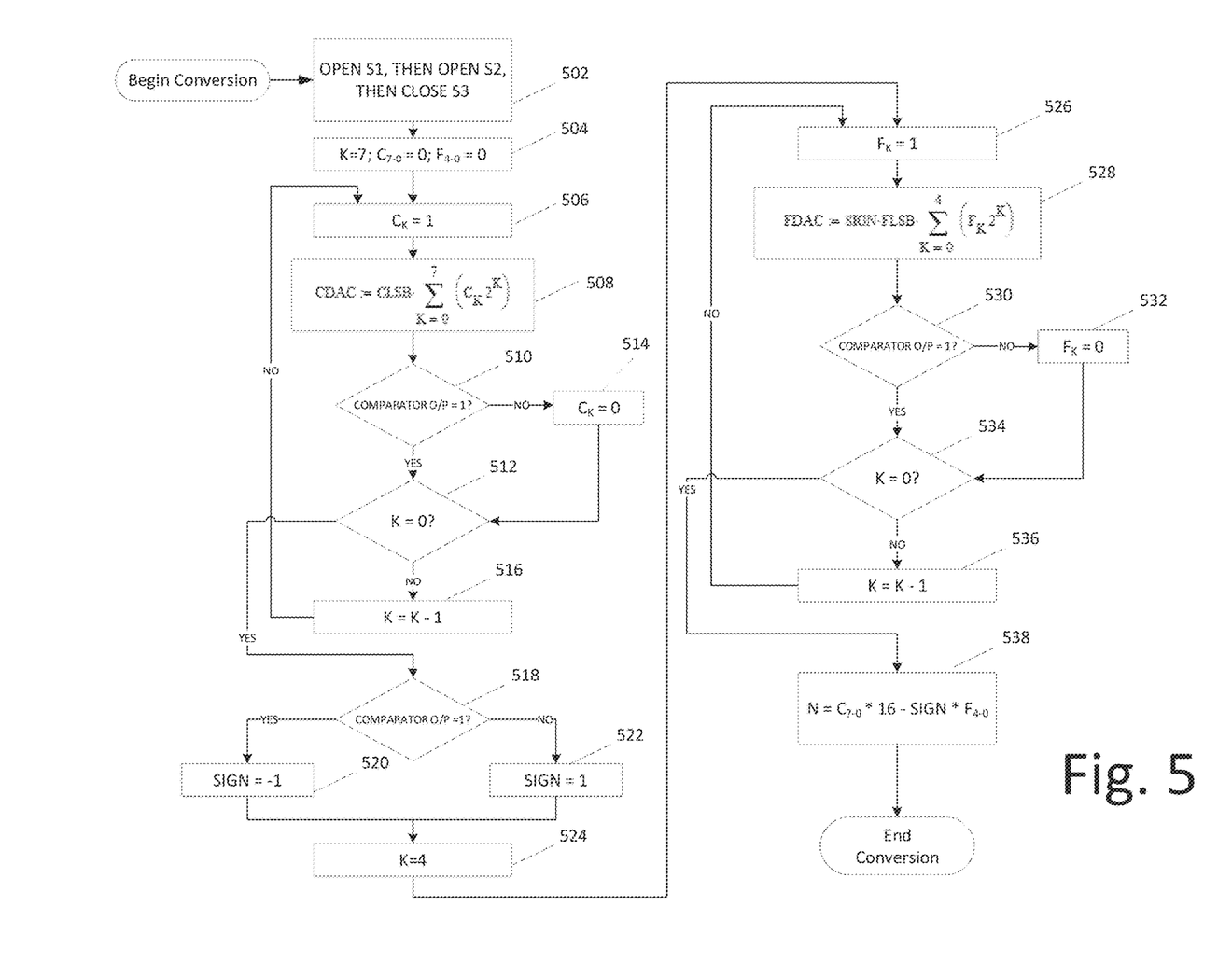
FIG. 5 is a flow chart describing the key steps in the conversion process for a 12-bit ADC using an 8-bit coarse phase and a 5-bit fine phase.

FIG. 5 is a flowchart illustrating a method 500 for converting a held signal to a 12-bit binary approximation, according to an embodiment of the present invention. The conversion interval begins after the switch S3 has closed and switches S1 and S2 are opened at 502. Each clock cycle tests a new bit combination. At 504, both coarse and fine words are initialized to all zeros and the loop variable K is set to 7. At 506, on the first clock cycle the MSB ($C_7$) is set to a 1, and at 508, is applied to the CDAC, which reconstructs the voltage corresponding to the MSB weight by connecting the CDAC output to the mid-scale tap of the segmented reference resistor. Near the end of the clock cycle, the comparator at 510 is strobed to latch the sign of the residue (voltage difference between positive and negative comparator inputs). If the comparator output is a 1, then the MSB is held at a 1 at 512; otherwise, at 514, if it is a zero, the MSB is set back to 0. At 512, the loop variable K is checked to see if it has reached 0. If K is greater than 0 at 512, the sequence proceeds to 516 or if a zero it proceeds to 518. Then, at 516, the coarse SAR engine decrements the variable K and on the next clock cycle loops back up to setting the second MSB ($C_6$) of the CDAC to 1. Again the CDAC reconstructs the coarse word by connecting the CDAC output to the appropriate tap on the segmented reference resistor and near the end of the clock cycle the comparator is latched. At 518, the comparator output is determined if 1 or 0. This process continues until K=0 after which the coarse word is held for the rest of the conversion interval. Prior to entering the fine phase, the sign value is set to 1 at 522 if the comparator output was 0 on the last coarse bit test and to −1 at 520 if the output was 1. At 524, K is set to 4. Then on the first clock cycle of the fine phase, the MSB ($F_4$) is set to a 1 at 526, and at 528, applied to the FDAC with the appropriate sign, which reconstructs the voltage corresponding to the MSB weight by connecting the FDAC output to the CDAC mid-point ±2 CLSB taps. If the sign value was a 1, then the FDAC output starts at $V_{CM}$−CLSB volts. If the sign value was a −1, then the FDAC output starts at $V_{CM}$+CLSB volts. Near the end of the clock cycle, the comparator is strobed to latch the sign of the residue voltage at its inputs. At 530, if the comparator output is a 1 then the MSB is held at a 1 at 534, and if it is a zero the MSB is set back to 0 at 532. Then, the fine SAR engine decrements the variable K if K is greater than 0 at 536 and on the next clock cycle loops back up setting the second MSB ($F_3$) of the FDAC to 1 at 526. Again, at 528 the FDAC reconstructs the fine word and near the end of the clock cycle the comparator is latched. This process continues until K=0 checked at 534 and proceeds to 538. When both the coarse and fine words have been determined, they are combined to form the N bit word using Equation (1).

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus using binary scaled digital-to-analog converter (DAC) outputs to successively arrive at an approximation of an input signal, the apparatus comprising:
a capacitor C1 configured to store a voltage difference between a voltage of an input signal arriving through a voltage input $V_{IN}$ through switch S2 and a common mode voltage $V_{CM}$ through switch S1;
a resistor based fully segmented coarse DAC (CDAC) with $2^C$ equal valued segments and at least $2^C-1$ switches tapping off of the segment junctions with one terminal of each of the switches connected together to provide a coarse output voltage dependent on an input code which selects one of the switches;
a resistor based fully segmented fine DAC (FDAC) with $2^F$ segments and at least $2^F$ switches tapping off of the segment junctions with one terminal of each of the switches connected together to provide an fine output voltage dependent on an input code which selects one of the switches with the fine taps placed between at least 2 coarse taps spanning the mid-point of the CDAC resistor segments;
a compensation resistor R1 placed between the positive input node of the comparator and the ground reference node;
a comparator configured to compare the difference between the output of the FDAC at its positive input and a sampled input voltage held by a top plate of the capacitor C1 at its negative input otherwise known as the residue voltage or residue;
a course successive approximation register (CSAR) engine configured to drive the switch on/off inputs of the CDAC with test bits to change the CDAC output voltage, wherein the CDAC output is connected to the bottom plate of the capacitor C1 through a CMOS switch S3;
a fine successive approximation register (FSAR) engine configured to drive the switch on/off inputs of the FDAC with test bits to change the output of the FDAC in one of two directions depending on the state of an output of the comparator during the last coarse test bit cycle; and
a non-overlapping clock generator for generating the individual control signals to switches S1, S2 and S3 in the proper sequence with no overlap of the signal edges.

2. The apparatus of claim 1, wherein the CDAC has a resolution of C bits and the FDAC has an effective resolution of at least F=N−C bits,
where N is the overall resolution of the apparatus.

3. The apparatus of claim 1, wherein the CSAR engine is configured to test or vary in a bit-by-bit sequence, starting at the coarse MSB, by setting the test bit to a 1 with the lower coarse bits to a 0, and after the residue has settled, latch the comparator and retain the test bit=1 value if the comparator output=1 when the sign of the residue is positive, or reset the test bit value to 0 if the comparator output=0 when the sign of the residue is negative, and subsequently test the next lower MSB bit with a 1 with lower bits to a 0 in a likewise sequence until the coarse LSB is tested, and
the FSAR engine comprises a FSAR code initially set to zeros, while the CSAR-CDAC ensemble is exercising a bit sequence.

4. The apparatus of claim 1, wherein after testing all of the CDAC bits a final coarse word is held while the FSAR code and thus the FDAC output is tested or varied in a bit-by-bit sequence starting at the fine MSB during the fine phase.

5. The apparatus of claim 1, wherein the FSAR engine is configured to iteratively set the FDAC MSB bit to a 1 and the lower coarse bits to a 0, and after the residue has settled, latch the comparator and retain the MSB=1 value if the sign of the residue is positive, or reset the MSB value to 0 if the sign of the residue is negative, and subsequently set the next lower MSB bit to a 1 with lower bits to a 0 in a likewise sequence until the fine LSB is tested.

6. The apparatus of claim 1, wherein the FSAR-FDAC ensemble selects via switches the CDAC segment(s) immediately below the mid-point of the CDAC resistor ladder if the comparator output was a 1 after the CDAC LSB bit was tested or the CDAC segment(s) immediately above the mid-point of the CDAC resistor ladder if the comparator output was a 0 after the CDAC LSB bit was tested.

7. The apparatus of claim 1, further comprising:
a plurality of resistors each of which arranged as a fully segmented architecture, wherein the fully segmented architecture associates one resistor for every coarse and fine bit weight.

8. The apparatus of claim 7, wherein each of the plurality of coarse resistor segments comprise a CDAC, all of which are arranged in a resistor divider with at least $2^C-1$ individual taps at the segment junctions.

9. The apparatus of claim 8, wherein the DAC is partitioned into two distinct sections, the two distinct sections comprising the CDAC and the FDAC.

10. The apparatus of claim 9, wherein the entire DAC is a single resistor tree comprising a $2^C$ element resistor, wherein at least $2^C-1$ of the taps are at a coarse LSB level and at least 2 of the mid-section coarse LSB taps drive a $2^F$ tap resistor segment sub-network embedded within the single CDAC resistor tree.

11. The apparatus of claim 10, wherein the $2^F$ sub-taps reflect fine (N-bit) LSB differences, where the overall system is monotonic so long as the coarse segmented resistor has a baseline of at least C-bit matching between segments and the segment mismatches are random.

12. An apparatus using binary scaled digital-to-analog converter (DAC) outputs to successively arrive at an approximation of an input signal, the apparatus comprising:
a capacitor C1 configured to store a voltage difference between a voltage of an input signal arriving through a voltage input $V_{IN}$ through switch S2 and a common mode voltage $V_{CM}$ through switch S1;
a resistor based fully segmented coarse DAC (CDAC) with $2^C$ equal valued segments and at least $2^C-1$ switches tapping off of the segment junctions with one terminal of each of the switches connected together to provide a coarse output voltage dependent on an input code which selects one of the switches;
a resistor based fully segmented fine DAC (FDAC) with $2^F$ segments and at least $2^F$ switches tapping off of the segment junctions with one terminal of each of the switches connected together to provide an fine output voltage dependent on an input code which selects one of the switches with the fine taps placed between at least 2 coarse taps spanning the mid-point of the CDAC resistor segments;
a compensation resistor R1 placed between the positive input node of the comparator and the ground reference node;

a comparator configured to compare the difference between the output of the FDAC at its positive input and a sampled input voltage held by a top plate of the capacitor C1 at its negative input otherwise known as the residue voltage or residue;

a course successive approximation register (CSAR) engine configured to drive the switch on/off inputs of the CDAC with test bits to change the CDAC output voltage, wherein the CDAC output is connected to the bottom plate of the capacitor C1 through a CMOS switch S3;

a fine successive approximation register (FSAR) engine configured to drive the switch on/off inputs of the FDAC with test bits to change the output of the FDAC in one of two directions depending on the state of an output of the comparator during the last coarse test bit cycle; and a non-overlapping clock generator for generating the individual control signals to switches S1, S2 and S3 in the proper sequence with no overlap of the signal edges, wherein the CDAC has a resolution of C bits and the FDAC has an effective resolution of at least F=N–C bits, wherein N is the overall resolution of the apparatus.

13. The apparatus of claim 12, wherein the CSAR engine is configured to test or vary in a bit-by-bit sequence, starting at the coarse MSB, by setting the test bit to a 1 with the lower coarse bits to a 0, and after the residue has settled, latch the comparator and retain the test bit=1 value if the comparator output=1 when the sign of the residue is positive, or reset the test bit value to 0 if the comparator output=0 when the sign of the residue is negative, and subsequently test the next lower MSB bit with a 1 with lower bits to a 0 in a likewise sequence until the coarse LSB is tested, and the FSAR engine comprises a FSAR code initially set to zeros, while the CSAR-CDAC ensemble is exercising a bit sequence.

14. The apparatus of claim 12, wherein after testing all of the CDAC bits a final coarse word is held while the FSAR code and thus the FDAC output is tested or varied in a bit-by-bit sequence starting at the fine MSB during the fine phase.

15. The apparatus of claim 12, wherein the FSAR engine is configured to iteratively set the FDAC MSB bit to a 1 and the lower coarse bits to a 0, and after the residue has settled, latch the comparator and retain the MSB=1 value if the sign of the residue is positive, or reset the MSB value to 0 if the sign of the residue is negative, and subsequently set the next lower MSB bit to a 1 with lower bits to a 0 in a likewise sequence until the fine LSB is tested.

16. The apparatus of claim 12, wherein the FSAR-FDAC ensemble selects via switches the CDAC segment(s) immediately below the mid-point of the CDAC resistor ladder if the comparator output was a 1 after the CDAC LSB bit was tested or the CDAC segment(s) immediately above the mid-point of the CDAC resistor ladder if the comparator output was a 0 after the CDAC LSB bit was tested.

17. The apparatus of claim 12, further comprising:
a plurality of resistors each of which arranged as a fully segmented architecture, wherein the fully segmented architecture associates one resistor for every coarse and fine bit weight.

18. The apparatus of claim 17, wherein each of the plurality of coarse resistor segments comprise a CDAC, all of which are arranged in a resistor divider with at least $2^C-1$ individual taps at the segment junctions.

19. The apparatus of claim 18, wherein the DAC is partitioned into two distinct sections, the two distinct sections comprising the CDAC and the FDAC.

20. The apparatus of claim 19, wherein the entire DAC is a single resistor tree comprising a $2^C$ element resistor, wherein at least $2^C-1$ of the taps are at a coarse LSB level and at least 2 of the mid-section coarse LSB taps drive a $2^F$ tap resistor segment sub-network embedded within the single CDAC resistor tree, and wherein the $2^F$ sub-taps reflect fine (N-bit) LSB differences, where the overall system is monotonic so long as the coarse segmented resistor has a baseline of at least C-bit matching between segments and the segment mismatches are random.

* * * * *